US009269925B2

(12) United States Patent
Song et al.

(10) Patent No.: US 9,269,925 B2
(45) Date of Patent: Feb. 23, 2016

(54) ARRAY SUBSTRATE INCLUDING WAVY TRANSFLECTIVE LAYER

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/100,741

(22) Filed: Dec. 9, 2013

(65) Prior Publication Data

US 2014/0159009 A1    Jun. 12, 2014

(30) Foreign Application Priority Data

Dec. 12, 2012   (CN) .......................... 2012 1 0537743

(51) Int. Cl.
| | |
|---|---|
| H01L 29/08 | (2006.01) |
| H01L 51/52 | (2006.01) |
| H01L 51/56 | (2006.01) |
| H01L 27/32 | (2006.01) |

(52) U.S. Cl.
CPC .......... *H01L 51/5271* (2013.01); *H01L 27/322* (2013.01); *H01L 51/5265* (2013.01); *H01L 51/56* (2013.01); *H01L 27/3206* (2013.01)

(58) Field of Classification Search
CPC ...... H01L 51/5271; H01L 51/56; H01L 51/52
USPC .............................................. 257/40; 438/29
See application file for complete search history.

(56) References Cited

U.S. PATENT DOCUMENTS

| | | | |
|---|---|---|---|
| 2005/0280364 A1 | 12/2005 | Omura et al. | |
| 2006/0221276 A1* | 10/2006 | Masumoto et al. ........... | 349/114 |

(Continued)

FOREIGN PATENT DOCUMENTS

| | | |
|---|---|---|
| JP | 2009259731 A | 11/2009 |
| JP | 2010-010020 A | 1/2010 |

(Continued)

OTHER PUBLICATIONS

Extended European Search Report issued by the European Patent Office ("EPO") on Mar. 13, 2014 for patent application No. 13196459.5, 8 pages.

(Continued)

*Primary Examiner* — Matthew Gordon
(74) *Attorney, Agent, or Firm* — Ladas & Parry LLP (57) ABSTRACT

Embodiments of the present invention provide an array substrate, a manufacturing method thereof and a display device. The array substrate comprises a plurality of pixel units disposed on a substrate, each pixel unit including a thin-film transistor (TFT) structure and an organic light-emitting diode (OLED) driven by the TFT structure. The OLED includes a transparent first electrode, an emission layer and a second electrode for reflecting light in sequence in a direction away from the substrate. A color filter disposed between a layer provided with the OLED and a layer provided with the TFT structure. A transflective layer disposed between the OLED and the color filter. The second electrode of the OLED and the transflective layer constitute a microcavity structure.

10 Claims, 4 Drawing Sheets

(56) References Cited

U.S. PATENT DOCUMENTS

| | | | |
|---|---|---|---|
| 2009/0108743 A1 | 4/2009 | Kobayashi | |
| 2009/0206733 A1 | 8/2009 | Hwang et al. | |
| 2009/0212696 A1 | 8/2009 | Terao | |
| 2009/0251051 A1* | 10/2009 | Hwang et al. | 313/504 |
| 2009/0261716 A1* | 10/2009 | Choi et al. | 313/504 |
| 2010/0084968 A1 | 4/2010 | Watanabe et al. | |
| 2011/0127533 A1 | 6/2011 | Chung et al. | |

FOREIGN PATENT DOCUMENTS

| | | | |
|---|---|---|---|
| JP | 2010010020 A | * | 1/2010 |
| JP | 2012-018868 A | | 1/2012 |
| KR | 20060046476 A | | 5/2006 |
| KR | 20080047782 A | | 5/2008 |
| KR | 20090092698 A | | 9/2009 |

OTHER PUBLICATIONS

English abstract of KR20080047782A, listed above, 1 page.
English abstract of JP2009259731A, listed above, 2 pages.
First Office action (Chinese language) issued by the State Intellectual Property Office ("SIPO") on Oct. 10, 2014 for application No. 2012105377433, 8 pages.
English translation of first Office action for appl'n. No. 2012105377433 (listed above), 10 pages.
Extended European Search Report dated Jul. 3, 2014; Appln. No. 13195595.7-1555.
First Chinese Office Action dated Oct. 10, 2014; Appln. No. 201210537743.3.
Korean Examination Opinion dated Dec. 18, 2014; Appln. No. 10-2013-0153034.
USPTO RR dated Nov. 19, 2014 in connection with U.S. Appl. No. 14/097,477.
USPTO NFOA dated Apr. 3, 2015 in connection with U.S. Appl. No. 14/097,477.
USPTO NOA mailed Jul. 20, 2015 in connection with U.S. Appl. No. 14/097,477.
Korean Office Action dated Jun. 24, 2015; Appln. No. 10-2013-0153034.
Korean Notice of Allowance dated Aug. 20, 2015; Appln. No. 10-2013-0153034.

* cited by examiner

ARRAY SUBSTRATE INCLUDING WAVY TRANSFLECTIVE LAYER

CROSS REFERENCE TO RELATED APPLICATIONS

This application claims priority from Chinese National Application No. 201210537743.3 filed on Dec. 12, 2012, the contents of which are incorporated herein by reference.

BACKGROUND

Embodiments of the present invention relate to an array substrate, a manufacturing method thereof and a display device.

Organic light-emitting diode (OLED) is considered to be one of the most important display technology in the future due to the advantages of simple manufacturing process, low cost, free adjustment of emitting colors within visible regions, large scale, flexible bending and the like. More particularly, the power efficiency of a white OLED (WOLED) has exceeded 60 lm/W and the service life of the WOLED has reached 20,000 hours or more, greatly promoting the development of the WOLED.

Figure 1:
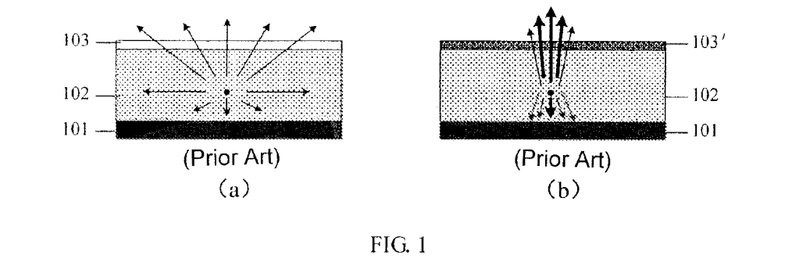
FIG. 1(a) is a schematic diagram of a conventional OLED without a microcavity structure.
FIG. 1(b) is a schematic structural view of a conventional microcavity structure.

As illustrated in FIG. 1(a), in one type of WOLED, an organic emission layer 102 is doped for three primitive colors RGB, so that it can emit white light. The organic emission layer 102 is disposed between a cathode 101 and an anode 103, and the white light emitted by the emission layer is reflected by the cathode 101 and emitted from the side of the anode 103. In order to improve the light transmittance and increase the brightness of a WOLED display device, a transflective layer 103' is respectively disposed corresponding to color filters of each color on one side of the anode, so that a microcavity structure can be formed, as illustrated in FIG. 1(b). The light is enhanced in the microcavity structure due to resonance effect.

SUMMARY

One embodiment of the present invention provides an array substrate comprising a plurality of pixel units disposed on a substrate, wherein each pixel unit comprises: a thin-film transistor (TFT) structure formed on the substrate; an organic light-emitting diode (OLED) driven by the TFT structure, the OLED being disposed on a pixel region of the pixel unit and comprising a transparent first electrode, an emission layer and a second electrode for reflecting light in sequence in a direction away from the substrate; a color filter disposed between a layer provided with the OLED and a layer provided with the TFT structure and disposed in the pixel region; and a transflective layer disposed between the first electrode of the OLED and the color filter, wherein the second electrode of the OLED and the transflective layer constitute a microcavity structure.

Another embodiment of the present invention provides a method for manufacturing an array substrate comprising the following steps of: forming a TFT structure and a pattern of passivation layer on a substrate so as to define a plurality of pixel units on a substrate; forming patterns of a color filter and a transflective layer in a pixel region of the pixel unit, so that the transflective layer is disposed on the color filter; and forming an OLED in the pixel region of the pixel unit, so that the transflective layer and the color filter are disposed between a layer provided with the OLED and a layer provided with the TFT structure and disposed in the pixel region.

Still another embodiment of the present invention provides a display device, which comprises the array substrate according to any embodiment of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 2:
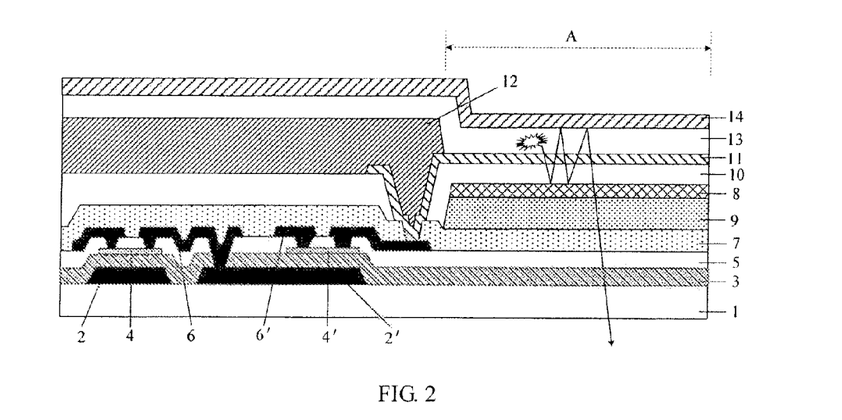
FIG. 2 is a schematic structural view of an array substrate provided by an embodiment of the present invention.

As illustrated in FIG. 2, the array substrate provided by the embodiment comprises: a plurality of gate lines and data lines and pixel units formed by the intersection of the gate lines and the data lines, which are formed on a substrate 1. Each pixel unit includes: a TFT structure formed on the substrate and an OLED driven by the TFT structure, wherein the OLED is disposed on a pixel region (generally referring to a display area except from the TFT structure) of the pixel unit, namely the area A in FIG. 5. The pixel unit further includes a color filter 9. The OLED includes a transparent first electrode 11, an emission layer 13 and a second electrode 14 for reflecting light in sequence in the direction away from the substrate 1.

In order to obtain a microcavity structure, the pixel unit of the array substrate provided by the embodiment further includes a transflective layer 8 disposed between the OLED and the color filter 9, and the second electrode 14 of the OLED and the transflective layer 8 constitute the microcavity structure. When light is reflected in a microcavity, due to the resonance effect, one part of light is strengthened and emitted, and thus the transmittance can be improved to a certain degree.

As illustrated in FIG. 2, the TFT structure includes: a first gate electrode 2, a second gate electrode 2' and gate lines (not shown in the figure) formed on the substrate 1, a gate insulating layer 3 formed on the first gate electrode 2, the second gate electrode 2' and the gate lines, a first active layer 4 and a second active layer 4' formed on the gate insulating layer 3, an insulating layer 5 formed on the first active layer 4 and the second active layer 4', a first source-drain layer 6 (including a first source electrode and a first drain electrode) and a second source-drain layer 6' (including a second source electrode and a second drain electrode) formed on the insulating layer 5, and a passivation layer 7 formed on the first source-drain layer 6 and the second source-drain layer 6'. The first gate electrode 2, the gate insulating layer 3, the first active layer 4, the insulating layer 5 and the first source-drain layer 6 constitute a switch TFT; and the second gate electrode 2', the gate insulating layer 3, the second active layer 4', the insulating layer 5 and the second source-drain layer 6' constitute a drive TFT.

In the embodiment, the color filter 9 is formed on the passivation layer 7; the transflective layer 8 is formed on the color filter 9. The OLED is disposed over the transflective layer 8 and the color filter 9 and formed on the pixel region A through a pixel defining layer (PDL). In the embodiment, the first electrode 11 is taken as an anode and the second electrode 14 is taken as a cathode (or alternatively: the first electrode 11 is taken as the cathode and the second electrode 14 is taken as the anode); the first electrode 11 is connected with the second drain electrode via a through hole in the passivation layer 7; and the second electrode 14 may be a reflecting electrode made of reflecting materials or a reflecting electrode formed by coating a reflecting layer on the second electrode 14.

A gate electrode (the first gate electrode 2) of the switch TFT is connected with the gate lines; a source electrode (the first source electrode) of the switch TFT is connected with data lines; a drain electrode (the first drain electrode) of the switch TFT is connected with a gate electrode (the second gate electrode 2') of the drive TFT; a source electrode (the second source electrode) of the drive TFT is connected with a supply voltage; and a drain electrode (the second drain electrode) of the drive TFT is connected with the first electrode 11 of the OLED. As illustrated in FIG. 2, white light emitted by a white light organic emission layer 13 is emitted from the bottom of the substrate 1 after running through the first electrode 11 and various layers under the first electrode 11. When the white light irradiates the transflective layer 8, one part of light is emitted and one part of light is reflected; and the reflected light is reflected again by the second electrode 14. When the reflected light is reflected between the transflective layer 8 and the second electrode 14, due to the resonance effect, the intensity of light with corresponding color and wavelength in the light finally emitted from the transflective layer 8 will be increased, and thus the transmittance can be improved.

Figure 3:
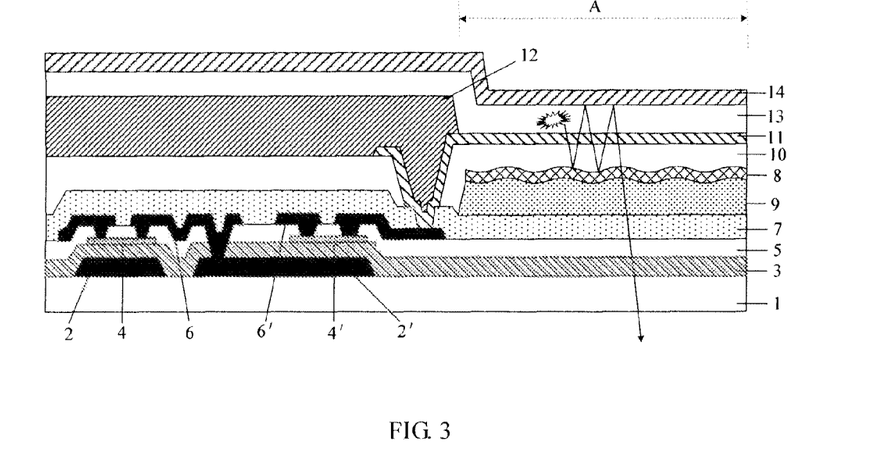
FIG. 3 is a schematic structural view of an array substrate provided by another embodiment of the present invention.

Moreover, in order to obtain more uniform emergent light, as illustrated in FIG. 3, the surface of the color filter 9 close to the OLED is a concave-convex surface formed by arranging a plurality of concave-convex structures or wavy structures in an array. As the transflective layer 8 formed on the color filter 9 has the same thickness, the surface of the transflective layer 8 on the color filter 9 is also a surface formed by arranging a plurality of concave-convex structures or wavy structures in an array (of course, may also be a surface formed by directly manufacturing a concave-convex structure or a wavy structure on a reflecting surface of the transflective layer 8). The light has different reflection angles on the concave-convex reflecting surface and is reflected in all directions, so that the emergent light can be more uniform. In addition, as the surface of the transflective layer has a concave-convex or wavy structure, the distance between the opposed surfaces of the second electrode 14 and the transflective layer 8 is varied within each pixel region; therefore, the intensity of light with various wavelengths can be increased by the microcavity formed by the transflective layer and the second electrode, and hence increasing the intensity of the light with different wavelengths via a complex microcavity structure can be avoided. For instance, a portion between the second electrode of the OLED and the lower surface of the color filter, in the pixel region, has a uniform thickness.

As mentioned above, since the microcavity structure according to the embodiment of the invention can enhance light with various wavelength, light with various color enhanced by the microcavity structure passes through the color filter corresponding to each pixel unit and the light with the desired cooler is obtained. Therefore, this microcavity structure can be suitable for pixel units of different colors. It can be know from the above that the microcavity structures in pixel units with different colors have the same layer structure. In addition, although the microcavity has various different distances between the two reflecting surface due to the concave-convex structure, the total thickness of the microcavity (from the second electrode to the transflective layer) and the color filter is constant for different pixel units; therefore, the manufacturing process can be simplified greatly.

In order to increase the space length of the microcavity structure and hence increase the transmittance, a resin layer 10 is further formed between the transflective layer 8 and the anode 11, and the first electrode 11 is connected with the second drain electrode via a through hole running through the passivation layer 7 and the resin layer 10. For instance, as illustrated in FIG. 2, the resin layer 10 is formed not only on the outside of the pixel region A but also on the TFT. However, the embodiment of the present invention is not limited to this case, and the resin layer 10 may also be only formed on the inside of the pixel region A.

In the embodiment, the transflective layer 8 is made of any metal taken from the group consisting of silver, aluminum, molybdenum, copper, titanium and chromium or an alloy formed by any two or more than two metals taken from the group consisting of silver, aluminum, molybdenum, copper, titanium and chromium; the transmittance is 5 to 95 percent; and the thickness is 10 to 200 Å. The thickness of the color filter 9 is 1,000 to 40,000 Å, and the color filter 9 may be an RGB, RGBY or RGBW mode color filter.

Figure 4:
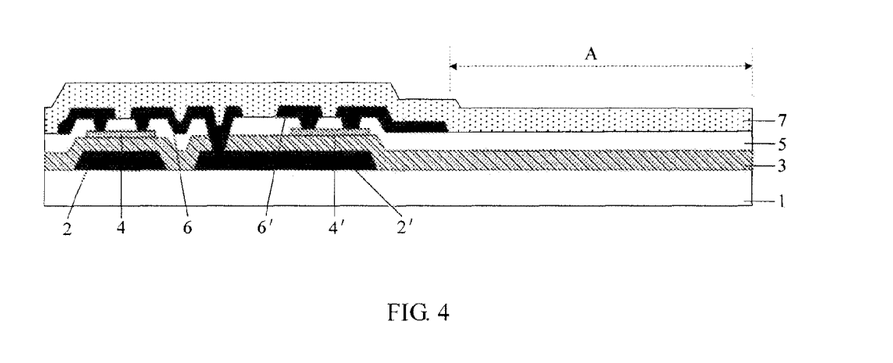
FIG. 4 is a schematic diagram of a substrate obtained by forming a TFT structure on a substrate in a method for manufacturing the array substrate in FIG. 2.

The present invention further provides a method for manufacturing the array substrate, which comprises:

Step 1: forming patterns of a TFT structure and a passivation layer 7 on a substrate 1 so as to define a plurality of pixel units on the substrate. The step is mainly as follows: firstly, corresponding film layers are formed (by coating, sputtering, deposition and the like); and secondly, patterns of corresponding layers are formed by patterning process (the patterning process generally includes photoresist coating, exposure, development, etching, photoresist removing and the like). The step is basically the same with the step in the conventional method for manufacturing the array substrate, and will not be further described herein. The substrate formed after the step is as illustrated in FIG. 4 which illustrates the structure of one pixel unit. An area at which the TFT structure is disposed is a non-pixel region, and a pixel region is represented by A. The TFT structure includes a switch TFT and a drive TFT, wherein the switch TFT is formed by a first gate electrode 2, a gate insulating layer 3, a first active layer 4, an insulating layer 5 and a first source-drain layer 6 (including a first source electrode and a first drain electrode); and the drive TFT is formed by a second gate electrode 2', the gate insulating layer 3, a second active layer 4', the insulating layer 5 and a second source-drain layer 6' (including a second source electrode and a second drain electrode).

Figure 5:
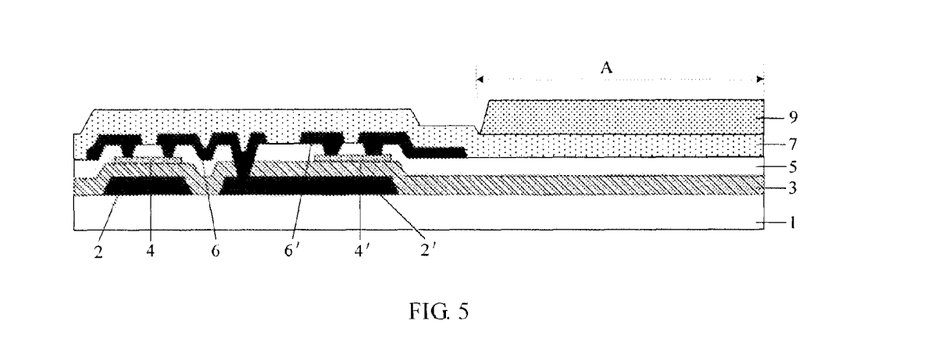
FIG. 5 is a schematic diagram of a substrate obtained by forming a color filter pattern on the substrate in FIG. 4.
Figure 6:
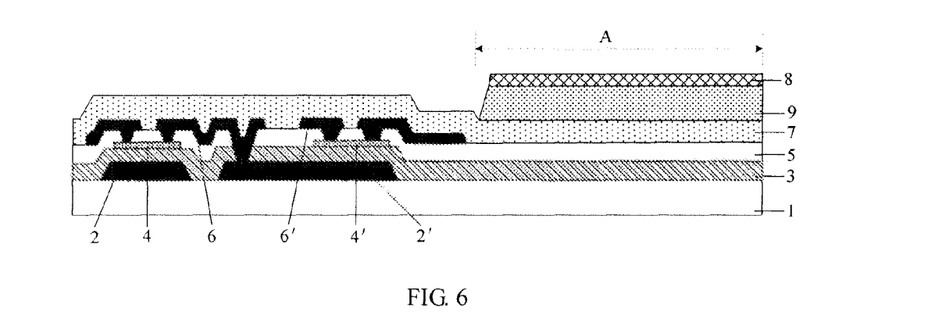
FIG. 6 is a schematic structural view of a substrate obtained by forming a transflective layer pattern on the substrate in FIG. 5.

Step 2: as illustrated in FIGS. 5 and 6, forming patterns of a transflective layer 8 and a color filter 9 on the pixel region A of the pixel unit, so that the transflective layer 8 is disposed on the color filter 9. The step comprises:

The pattern of color filter 9 is formed by multiple steps (3 steps as for RGB mode): a color filter of one color is formed each time, and color filters of other colors are formed successively, and hence the whole pattern of the color filter 9 is formed. For instance, a color filter film of one color is formed on a passivation layer, and hence the color filter of the one color is formed on the pixel region A by patterning process; color filters of other colors are formed successively by the similar means; and hence the whole pattern of color filter 9 is formed. For instance, the thickness of the color filter 9 is 1,000 to 40,000 Å.

Moreover, a transflective film is formed on the color filter 9. The transflective layer is made of any metal taken from the group consisting of silver, aluminum, molybdenum, copper, titanium and chromium or an alloy formed by any two or more than two metals taken from the group consisting of silver, aluminum, molybdenum, copper, titanium and chromium; and the transmittance is 5 to 95 percent. In addition, the pattern of the transflective layer 8 is formed on the pixel region A by patterning process after the transflective film is formed.

Furthermore, when the color filter of each color is formed, a plurality of concave-convex structures or wavy structures are formed on the surface of the film close to an OLED. Subsequently, a transflective film with uniform thickness is formed on the surface on which the concave-convex structures or the wavy structures are formed (that is to say, the transflective film is conformally formed on the color filter), so that a plurality of concave-convex structures or wavy structures are formed on the surface of the formed transflective layer 8. In addition, the method for forming the concave-convex structures or the wavy structures on the surface of the transflective layer 8 is not limited to the above method and may also adopt any appropriate method.

Figure 7:
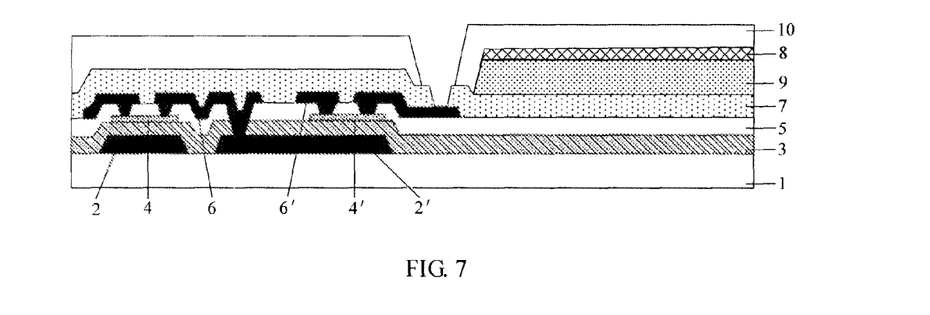
FIG. 7 is a schematic structural view of a substrate obtained by forming a resin layer pattern on the substrate in FIG. 6.

Step 3: forming an OLED on the pixel region A of the pixel unit, so that the transflective layer 8 and the color filter 9 are disposed between a layer provided with the OLED and a layer provided with the TFT structure. The step further comprises:

As illustrated in FIG. 7, a through hole is formed in the passivation layer 7 by etching through patterning process. In order to increase the space length of a microcavity structure and hence increase the transmittance, a resin layer 10 may further be formed on the passivation layer 7, and the through hole runs through the passivation layer 7 and the resin layer 10. In addition, if the resin layer 10 is only formed in the pixel region A, the through hole only needs to run through the passivation layer 7.

Figure 8:
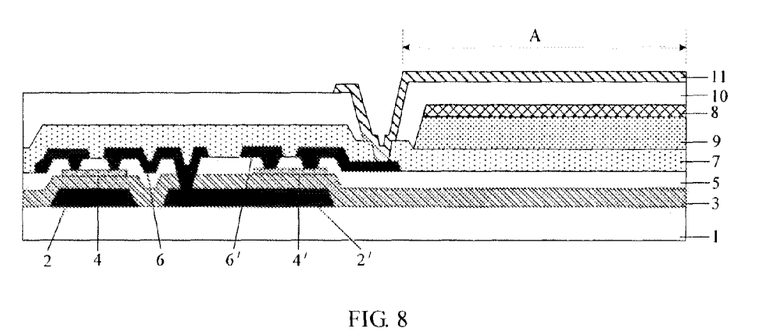
FIG. 8 is a schematic structural view of a substrate obtained by forming an anode on the substrate in FIG. 7.

As illustrated in FIG. 8, a transparent conductive film is formed, and hence a pattern of a first electrode 11 of the OLED is formed by patterning process, so that the first electrode 11 is connected with the TFT structure, more specifically, connected with a drain electrode of the drive TFT, via the through hole.

Figure 9:
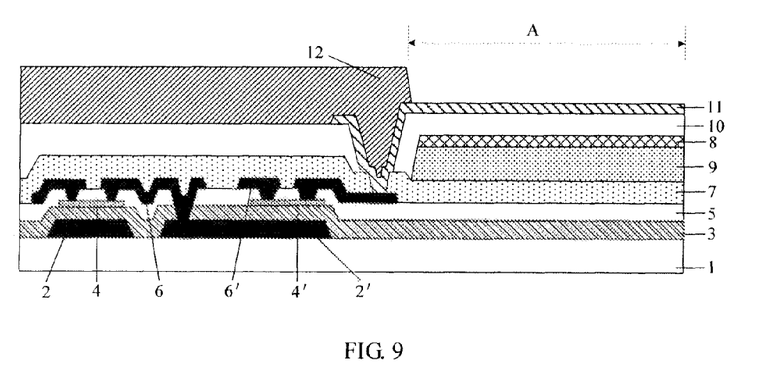
FIG. 9 is a schematic structural view of a substrate obtained by forming a pixel defining layer pattern on the substrate in FIG. 8.

As illustrated in FIG. 9, firstly, an insulating film is formed, and hence a pattern of a pixel defining layer 12 is formed by patterning process, so that the position for forming the OLED is defined on the pixel region A.

An organic emission layer 13 and a second electrode 14 of the OELD are formed, and hence the OLED is formed. The finally formed array substrate is as illustrated in FIG. 2. The second electrode 14 is a reflecting electrode and may be made of reflecting materials; or alternatively, a reflecting layer is formed before the process of forming the second electrode 14 and hence the second electrode 14 is formed on the reflecting layer; or alternatively, the second electrode 14 is formed and hence the reflecting layer is formed on the second electrode 14.

The present invention further provides a display device, which comprises the foregoing array substrate. The display device may be electronic paper, an OLED panel, an OLED display, an OLED TV, a digital picture frame, a mobile phone, a tablet PC or any other product or component with display function.

As described above, the embodiment of the present invention at least provides the following structures and methods:

(1) An array substrate, comprising a plurality of pixel units disposed on a substrate, wherein each pixel unit includes:

a TFT structure formed on a substrate;

an OLED driven by the TFT structure, the OLED being disposed on a pixel region of the pixel unit and including a transparent first electrode, an emission layer and a second electrode for reflecting light in sequence in a direction away from the substrate;

a color filter disposed between a layer provided with the OLED and a layer provided with the TFT structure; and a transflective layer disposed between the first electrode of the OLED and the color filter, wherein the second electrode of the OLED and the transflective layer constitute a microcavity structure.

(2) The array substrate according to (1), wherein the TFT structure includes: a first gate electrode and a second gate electrode formed on the substrate, a gate insulating layer formed on the first gate electrode and the second gate electrode, a first active layer and a second active layer formed on the gate insulating layer, a first source electrode and a first drain electrode formed on the first active layer, and a second source electrode and a second drain electrode formed on the second active layer, in which the first drain electrode is connected with the second gate electrode; the first gate electrode, the gate insulating layer, the first active layer, the first source electrode and the first drain electrode constitute a switch TFT; the second gate electrode, the gate insulating layer, the second active layer, the second source electrode and the second drain electrode constitute a drive TFT; and the second drain electrode of the drive TFT is electrically connected with the first electrode of the OLED.

(3) The array substrate according to (1) or (2), wherein a passivation layer is further formed on the TFT structure; the OLED is formed above the passivation layer; the second electrode of the OLED is taken as a cathode, and the first electrode is taken as an anode which is connected with the second drain electrode via a through hole of the passivation layer; the color filter is formed on the passivation layer; the transflective layer is formed on the color filter; both the transflective layer and the color filter are disposed in the pixel region of the pixel unit; and the anode of the OLED is disposed over the transflective layer.

(4) The array substrate according to (1) or (2), wherein a passivation layer is further formed on the TFT structure; the OLED is formed above the passivation layer; the first electrode of the OLED is taken as a cathode, and the second electrode is taken as an anode; the cathode is connected with the second drain electrode via a through hole of the passivation layer; the color filter is formed on the passivation layer; the transflective layer is formed on the color filter; both the transflective layer and the color filter are disposed in the pixel region of the pixel unit; and the cathode of the OLED is disposed over the transflective layer.

(5) The array substrate according to any one of (1) to (4), wherein the surface of the transflective layer close to the OLED is a surface formed by arranging a plurality of concave-convex structures or wavy structures in an array.

(6) The array substrate according to any one of (1) to (4), wherein the surface of the color filter close to the OLED is a concave-convex structure formed by arranging a plurality of concave-convex structures or wavy structures in an array; and the transflective layer is formed on the concave-convex surface and has a uniform thickness.

(7) The array substrate according to any one of (1) to (6), wherein a resin layer is further disposed between the transflective layer and the first electrode is connected with the second drain electrode via the through hole running through the resin layer and the passivation layer.

(8) The array substrate according to any one of (1) to (7), wherein a pixel defining layer is further formed at a region corresponding to the TFT structure of the pixel unit and disposed above the first electrode.

(9) The array substrate according to any one of (1) to (8), wherein the transflective layer is made of any metal taken from the group consisting of silver, aluminum, molybdenum, copper, titanium and chromium or an alloy formed by any two or more than two metals taken from the group consisting of silver, aluminum, molybdenum, copper, titanium and chromium; and has a transmittance of 5 to 95 percent.

(10) The array substrate according to any one of (1) to (9), wherein the thickness of the transflective layer is 10 to 200 Å.

(11) The array substrate according to any one of (1) to (10), wherein the thickness of the color filter is 1,000 to 40,000 Å.

(12) The array substrate according to any one of (1) to (11), wherein the color filter is a RGB, RGBY or RGBW mode color filter.

(13) A method for manufacturing an array substrate, comprising the following steps of:
  forming patterns of a TFT structure and a passivation layer on a substrate so as to define a plurality of pixel units on the substrate;
  forming patterns of a color filter and a transflective layer on a pixel region of the pixel unit, so that the transflective layer is disposed on the color filter; and
  forming an OLED on the pixel region of the pixel unit, so that the transflective layer and the color filter are disposed between the OLED and the TFT structure.

(14) The method according to (13), wherein the step of forming the patterns of the color filter and the transflective layer on the pixel region of the pixel unit comprises:
  forming a color filter film of one color, forming a color filter of the one color on the pixel region by patterning process, forming color filters of other colors successively by the similar means, and hence forming the pattern of the color filter; and
  forming a transflective film on the color filter, and forming a pattern of the transflective layer in the pixel region by patterning process.

(15) The method according to (13), wherein, the step of forming the patterns of the color filter and the transflective layer on the pixel region of the pixel unit comprises:
  forming a color filter film of one color, forming a color filter of the one color on the pixel region by patterning process, forming color filters of other colors successively by the similar means, and hence forming the pattern of the color filter, wherein a plurality of concave-convex structures or wavy structures are formed on the surface of the color filter of each color close to the OLED; and
  forming a transflective film on the color filter so that the transflective film has a uniform thickness, and forming the pattern of the transflective layer on the pixel region by patterning process.

(16) The method according to (13), wherein, the step of forming the OLED in the pixel region of the pixel unit comprises:
  forming a through hole in the passivation layer by etching through patterning process;
  forming a transparent conductive film, and forming a pattern of a first electrode of the OLED by patterning process so that the first electrode is connected with the TFT structure via the through hole;
  forming an insulating film, and forming a pattern of a pixel defining layer by patterning process so that the position for forming the OLED is defined in the pixel region;
  forming an organic emission layer; and
  forming a second electrode for reflecting light of the OLED, so as to form the OLED.

(17) The method according to (13), further comprising the step of forming a resin layer after the step of forming the patterns of the color filter and the transflective layer and before the step of forming the OLED.

(18) The method according to (17), wherein, the step of forming the OLED on the pixel region of the pixel unit comprises:
  forming a through hole running through the resin layer and the passivation layer by patterning process;
  forming a transparent conductive film, and forming a pattern of a first electrode of the OLED by patterning process so that the first electrode is connected with the TFT structure via the through hole;
  forming an insulating film, and forming a pattern of the pixel defining layer by patterning process, so that the position for forming the OLED is defined in the pixel region;
  forming an organic emission layer; and
  forming a second electrode for reflecting light of the OLED, so as to form the OLED.

(19) The method according to any one of (13)-(18), wherein, the transflective layer is made of any metal taken from the group consisting of silver, aluminum, molybdenum, copper, titanium and chromium or an alloy formed by any two or more than two metals taken from the group consisting of silver, aluminum, molybdenum, copper, titanium and chromium; and the transmittance is 5 to 95 percent.

(20) The method according to any one of (13)-(18), wherein, the thickness of the transflective layer is 10 to 200 Å.

(20) The method according to any one of (13)-(18), wherein, the thickness of the color filter is 1,000 to 40,000 Å.

The present invention further provides a display device, which comprises the foregoing array substrate.

The foregoing is merely exemplary embodiments of the invention, but is not used to limit the protection scope of the invention. The protection scope of the invention shall be defined by the attached claims.

What is claimed is:
1. An array substrate, comprising a plurality of pixel units disposed on a substrate, wherein each pixel unit comprises:
  a thin-film transistor (TFT) structure formed on the substrate;
  an organic light-emitting diode (OLED) driven by the TFT structure, the OLED being disposed on a pixel region of the pixel unit and comprising a transparent first elec- trode, an emission layer and a second electrode for reflecting light in sequence in a direction away from the substrate;

a color filter disposed between a layer provided with the OLED and a layer provided with the TFT structure and disposed in the pixel region; and a transflective layer disposed between the first electrode of the OLED and the color filter, wherein the second electrode of the OLED and the transflective layer constitute a microcavity structure, wherein a surface of the transflective layer close to the OLED is a surface formed by arranging a plurality of concave-convex structures or wavy structures in an array, and wherein the plurality of concave-convex structures or wavy structures of the surface of the transflective layer is included in each pixel unit, and the second electrode is a flat layer.

2. The array substrate according to claim 1, wherein a surface of the color filter close to the OLED is a concave-convex surface formed by arranging a plurality of concave-convex structures or wavy structures in an array; and the transflective layer is conformally formed on the concave-convex surface.

3. The array substrate according to claim 1, wherein a passivation layer is further formed on the TFT structure; the OLED is formed on the passivation layer; the first electrode of the OLED is connected with the TFT structure via a through hole in the passivation layer; the color filter is formed on the passivation layer; the transflective layer is formed on the color filter and disposed in the pixel region of the pixel unit; the first electrode of the OLED is disposed over the transflective layer; and one of the first electrode and the second electrode is an anode, and the other electrode of the first electrode and the second electrode is a cathode.

4. The array substrate according to claim 3, wherein a resin layer is further formed between the transflective layer and the first electrode; and the first electrode is connected with the TFT structure via the through hole running through the resin layer and the passivation layer.

5. The array substrate according to claim 1, wherein the TFT structure comprises: a first gate electrode and a second gate electrode formed on the substrate, a gate insulating layer formed on the first gate electrode and the second gate electrode, a first active layer and a second active layer formed on the gate insulating layer, a first source electrode and a first drain electrode formed on the first active layer, and a second source electrode and a second drain electrode formed on the second active layer, and the first drain electrode is connected with the second gate electrode; the first gate electrode, the gate insulating layer, the first active layer, the first source electrode and the first drain electrode constitute a switch TFT; the second gate electrode, the gate insulating layer, the second active layer, the second source electrode and the second drain electrode constitute a drive TFT; and the second drain electrode of the drive TFT is electrically connected with the first electrode of the OLED.

6. The array substrate according to claim 1, wherein the transflective layer is made of any metal taken from the group consisting of silver, aluminum, molybdenum, copper, titanium and chromium or an alloy formed by any two or more than two metals taken from the group consisting of silver, aluminum, molybdenum, copper, titanium and chromium, and has a transmittance of 5 to 95 percent.

7. The array substrate according to claim 1, wherein a portion between the second electrode of the OLED and a lower surface of the color filter has a uniform thickness within the pixel region.

8. The array substrate according to claim 1, wherein the thickness of the transflective layer is 10 to 200 Å.

9. The array substrate according to claim 1, wherein the thickness of the color filter is 1,000 to 40,000 Å.

10. A display device, comprising the array substrate according to claim 1.

* * * * *